(12) United States Patent
Razon et al.

(10) Patent No.: US 6,227,437 B1
(45) Date of Patent: May 8, 2001

(54) SOLDER BALL DELIVERY AND REFLOW APPARATUS AND METHOD OF USING THE SAME

(75) Inventors: Eli Razon, Maple Glen; Vaughn Svendsen, Ambler; Krishnan Suresh, Willow Grove; Robert Kowtko, Warrington; Kyle Dury, Newton, all of PA (US)

(73) Assignee: Kulicke & Soffa Industries Inc., Willow Grove, PA (US)

( * ) Notice: Subject to any disclaimer, the term of this patent is extended or adjusted under 35 U.S.C. 154(b) by 0 days.

(21) Appl. No.: 09/382,228

(22) Filed: Aug. 24, 1999

(51) Int. Cl.[7] .............. B23K 1/20; B23K 1/00; B23K 5/00; B65D 83/00; B65D 85/58
(52) U.S. Cl. .............. 228/254; 228/13; 228/14; 228/244; 228/248.1; 222/549; 221/150 R; 221/267; 221/268; 221/269; 221/270; 221/278
(58) Field of Search .............. 228/254, 13, 14, 228/244, 248.1; 222/549; 221/150, 267, 268, 269

(56) References Cited

U.S. PATENT DOCUMENTS

| | | |
|---|---|---|
| 3,526,743 * | 9/1970 | Spisak . |
| 4,101,284 * | 7/1978 | Difiglio et al. . |
| 4,442,967 | 4/1984 | van de Pas et al. . |
| 4,767,047 * | 8/1988 | Todd et al. . |
| 4,871,110 | 10/1989 | Fukasawa et al. . |
| 5,014,111 | 5/1991 | Tsuda et al. . |
| 5,193,738 | 3/1993 | Hayes . |
| 5,284,287 | 2/1994 | Wilson et al. . |
| 5,320,273 * | 6/1994 | Goenka et al. . |
| 5,415,321 * | 5/1995 | Gehlert et al. . |
| 5,421,504 | 6/1995 | Spirig . |
| 5,425,493 | 6/1995 | Interrante et al. . |
| 5,431,332 | 7/1995 | Kirby et al. . |
| 5,445,313 | 8/1995 | Boyd et al. . |
| 5,467,913 | 11/1995 | Namekawa et al. . |
| 5,484,979 | 1/1996 | Gao . |
| 5,506,385 | 4/1996 | Murakami et al. . |
| 5,540,377 | 7/1996 | Ito . |
| 5,565,119 | 10/1996 | Behun et al. . |
| 5,601,229 | 2/1997 | Nakazato et al. . |
| 5,653,381 | 8/1997 | Azdasht . |
| 5,655,704 | 8/1997 | Sakemi et al. . |
| 5,695,667 * | 12/1997 | Eguchi et al. . |
| 5,768,775 | 6/1998 | Nakazato . |
| 5,828,031 * | 10/1998 | Pattanaik . |
| 5,829,632 * | 11/1998 | Gehlert et al. . |
| 5,839,641 * | 11/1998 | Teng . |
| 5,857,610 | 1/1999 | Hoshiba et al. . |
| 5,878,911 * | 3/1999 | Lin et al. . |
| 5,897,049 | 4/1999 | Nakamura et al. . |
| 5,899,737 | 5/1999 | Trabucco . |

(List continued on next page.)

FOREIGN PATENT DOCUMENTS

WO 97/20654   6/1997   (WO) .

OTHER PUBLICATIONS

An Innovative Solution For Solder Application Solder Ball Bumper (SBB), PAC TECH Brochure.

Primary Examiner—Patrick Ryan
Assistant Examiner—Collen Cooke
(74) Attorney, Agent, or Firm—Ratner & Prestia (57) ABSTRACT

An apparatus and method for high speed, reliable and repeatable delivery and reflow of solder material onto a substrate are disclosed. The apparatus has a repositionable capillary to direct individual solder material to a specific location on the substrate. An energy source is directed through the capillary onto the solder to reflow the solder to the substrate. The apparatus provides for individual introduction of the solder material into the capillary and urging of the solder material from a reservoir to the capillary while preventing unintended jams and blockage of the solder material.

23 Claims, 5 Drawing Sheets

U.S. PATENT DOCUMENTS

| | | | |
|---|---|---|---|
| 5,917,156 | * | 6/1999 | Nobori et al. . |
| 5,918,792 | | 7/1999 | Stumpe et al. . |
| 5,921,458 | * | 7/1999 | Fan . |
| 5,977,512 | | 11/1999 | Azdasht et al. . |
| 5,981,371 | | 11/1999 | Yamazaki et al. . |
| 6,003,753 | | 12/1999 | Hwang et al. . |
| 6,053,398 | * | 4/2000 | Iizuka et al. . |
| 6,056,190 | | 5/2000 | Foulke et al. . |

\* cited by examiner

SOLDER BALL DELIVERY AND REFLOW APPARATUS AND METHOD OF USING THE SAME

BACKGROUND OF THE INVENTION

This invention generally relates to the placement and reflow of solder balls on substrates used in the electronics field. More particularly, the present invention relates to an improved apparatus and method for the high speed placement and reflow of solder balls using a high energy laser and an inert gas to ensure repeatable, precise placement and reflow at rates exceeding 40 balls per second.

DESCRIPTION OF THE RELATED ART

With the increased demand for high speed and miniaturized electronics, the need to reliably and repeatably produce integrated circuit (IC) substrates and substrates used for semiconductors has also grown. Such electronic components include plastic ball grid arrays ("PBGA"), chip scale packages ("CSP"), and direct chip attach ("DCA") components. One important step in the manufacture of such substrates is the placement of solder connection points in specific locations on the substrate.

With the expanding general demand for substrates, there has also been a continuing reduction in size of electronic components and an increase in the number of circuits, and therefore electrical connection points required on each substrate. As such, the number of and density of solder connection points on substrates has substantially increased. As compared to substrates manufactured several years ago, today's substrates used for IC chips or semiconductors has substantially more and higher density solder connection points. It is expected that such miniaturization of substrates and an increase in the required solder connection points will continue into the future.

As demands of higher speed and more sophisticated electronic devices has expanded, the respective demands for precise placement and reflow of solder material onto substrates used in manufacturing the devices has likewise grown. Attempting to keep pace with these demands, the technology of delivery and reflow of solder material has also been developing.

Representative prior art includes U.S. Pat. No. 5,467,913 issued to Namekawa et al. for a Solder Ball Supply Device. The Namekawa et al. device uses a discharger with a matrix of solder ball holding cavities, a head section having a number of air suction holes, and a solder ball supply means to take out, at one time, a large number of solder balls from the holding cavities and to place them, at one time, onto a substrate board. While this device may be able to place a number of solder connection points onto a substrate at one time, the device does not allow for easy alteration or modification of the patterns or matrices of solder connection points.

A different method of placing and bonding solder to a bonding surface is shown by the apparatus and process disclosed in U.S. Pat. No. 5,653,381 issued to Azdasht for a Process And Apparatus For Producing A Bonded Metal Coating. The Azdasht device uses specific solder material that may be transported within a capillary to a bonding surface by a physical stamp guided within the capillary. The physical stamp may also be an energy transfer device used to bond the solder material to the surface after it is "stamped" into place. While the "one at a time" placement and bonding of the solder appears to allow for easy reconfiguration of solder connection patterns between substrates, the device and method do not appear to be suitable for the high speed bonding required for mass production of substrates. Indeed, the Azdasht U.S. patent provides that an object of the device is for "pilot or same-scale production" runs. PCT application WO 97/20654, for a Process And Device For Applying A Solder To A Substrate Or Chip Without Flux, also having as its inventor Ghassem Azdasht, is a German application. The Abstract, in English, describes a process and device to clean a region on a substrate and remelt solder to the substrate.

Devices similar to that described in the Azdasht U.S. patent are available from PAC TECH, Packaging Technologies GmbH. Such "solder ball bumper bondhead" machines are limited to ball placement and bonding rates of approximately 2 balls per second. As noted, with the reduction in the size of IC chips and semiconductors, and the circuits contained therein, and with the increase in the number of solder connections required to be on each substrate, there is a need for increased production speeds to place and bond or reflow solder balls to a substrate.

Accordingly, there remains a need for reliable and repeatable high speed delivery and reflow of solder connection points, or solder balls, onto substrates. Such reliability and repeatability is necessary for mass production of IC chips and semiconductors. Moreover, there is a need for such high speed delivery and reflow of solder balls with the flexibility of easy reconfiguration of the solder connection point patterns between different substrates.

SUMMARY OF THE INVENTION

In view of the shortcomings of the prior art, it is an object of the present invention to improve the speed, reliability and repeatability of delivering and reflowing solder material to a substrate. It is a further object of the present invention that the apparatus and method provide high speed capability of delivery and reflow of solder material necessary for mass production of substrates. Yet another object of the present invention is to permit easy and flexible modification of the solder material pattern on a substrate through use of a computer processor.

In a preferred embodiment, the present invention is an apparatus for delivering and reflowing solder material onto a substrate, comprising a reservoir to hold the solder material; a capillary for guiding the solder material to the substrate; a feed tube coupled to the reservoir for directing the solder material from the reservoir to the capillary; indexing means coupled to the feed tube and the capillary to individually index the solder material from the feed tube into the capillary; deliver means to deliver the solder material from the reservoir, through (a) the feed tube, (b) the indexing means, (c) the capillary and onto the substrate; and an energy source coupled to the capillary to reflow the solder material onto the substrate. In one preferred embodiment, the energy source is a laser.

According to another aspect of the invention, the delivery means comprises a pressurized fluid introduced into the reservoir to urge the solder material through the feed tube, through the indexing means, through the capillary and onto the substrate. The pressurized fluid, in preferred embodiments may be an inert gas, such as nitrogen.

According to still another aspect of the invention, the feed tube comprises a first tube and a second tube within the first tube, such that the second tube is substantially centered within the first tube, the second tube being for delivery of the solder material from the reservoir and the first tube for delivery of the pressurized fluid into the reservoir.

According to yet another aspect of the present invention, the delivery and reflow of the solder balls is approximately at least 40 balls each second.

According to another aspect of the present invention, a method of delivering and reflowing solder material onto a substrate, the method comprising the steps of: (a) urging solder material held in a reservoir through a feed tube by a pressurized fluid; (b) individually indexing the solder material from the feed tube into a capillary; (c) reacting the individual solder material through the capillary to the substrate; and (d) reflowing the individual solder material to the substrate with an energy source.

These and other aspects of the present invention are set forth below with reference to the drawings and the detailed description of certain preferred embodiments.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

The present invention is an improved apparatus and method for delivering and reflowing solder material onto substrates that are used in the manufacture of IC chips, semiconductor devices, or other miniaturized electronic circuits.

The improvements of the present invention increase the speed of delivery and reflow of the solder onto a substrate in a highly reliable and repeatable process. As noted above, with the increased number of solder connections required on electrical circuit substrates, the repeatable and precise placement of all solder connections is critical to the success of a production method and apparatus. For example, if the last solder ball on a substrate containing hundreds of connection points is misplaced or misformed, the entire substrate may be unusable. Accordingly, a high degree of reliability and repeatability is required and is achieved with the improvements of the present invention.

Although the solder material are generally described herein as solder balls, it is to be understood that the solder material may be in shapes other than spherical. The scope and spirit of the present invention is not limited to spherical shaped solder material, but is intended to encompass other shapes as well.

Figure 1:
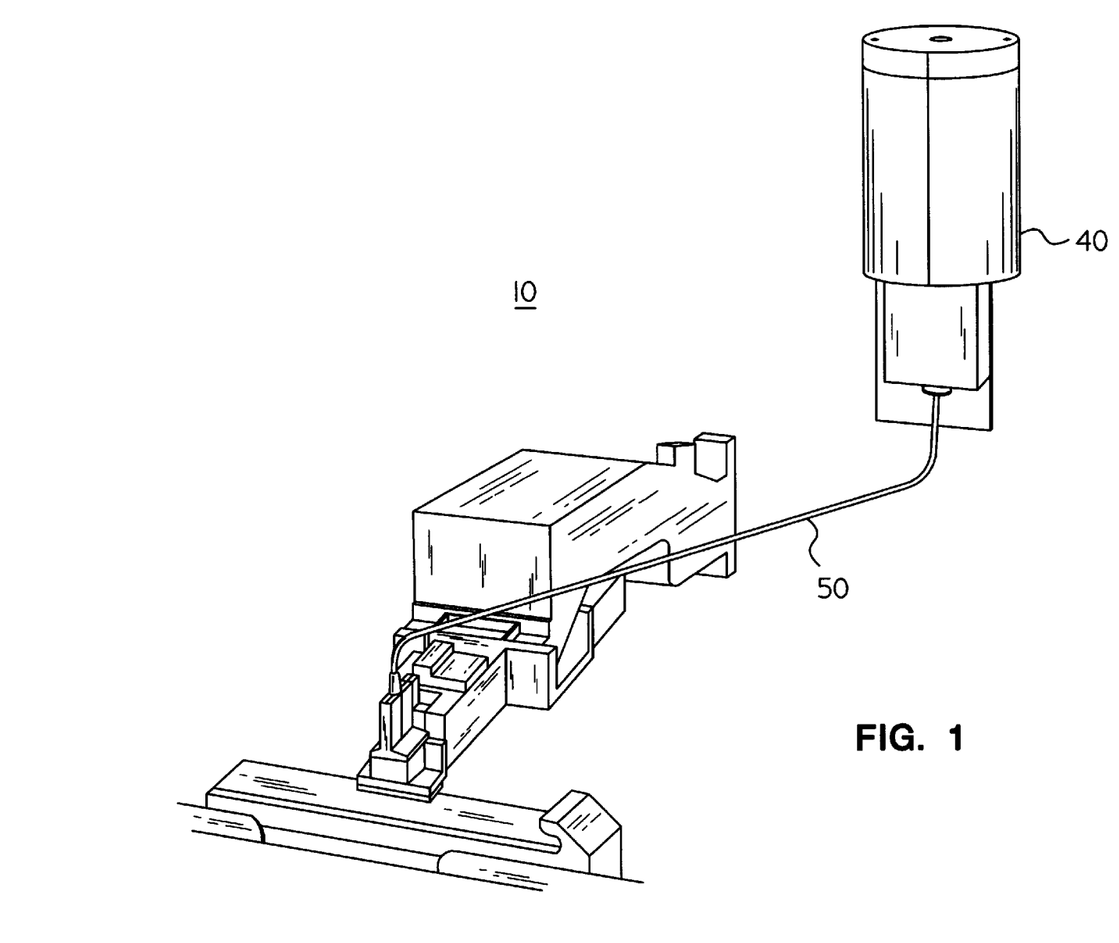
FIG. 1 is a schematic view of an exemplary embodiment of the present solder delivery and reflow invention.

In an exemplary embodiment of the present invention, the delivery and reflow apparatus, as illustrated in FIG. 1, has a translatable capillary for guiding solder material onto a substrate. The capillary is capable of translating in three degrees of freedom, being the x, y and z directions. For reference, the x and y directions are within the plane of the substrate, while the z-direction is perpendicular to the plane of the substrate.

Proceeding upstream from the substrate, the solder material is individually indexed into the capillary where the solder is guided onto the substrate. The solder material is delivered to the indexing component by a feed tube connected to a reservoir. The reservoir maintains a supply of solder material to be individually reflowed to the substrate. After the solder material is delivered onto the substrate by the positioning of the capillary, an energy source is used to reflow the solder onto the substrate. The capillary is then repositioned to the next location over the substrate to deliver and reflow the next solder material. Because high-speed delivery, placement and reflow of the solder balls is an objective of the present invention, the speed of moving the capillary is an important aspect. As such, the capillary is designed to be lightweight. Moreover, the components of the present invention that are translated with the capillary are intended to be minimized. In that regard, the solder ball reservoir is, in a preferred embodiment, separated from the capillary and is stationary.

Figure 2:
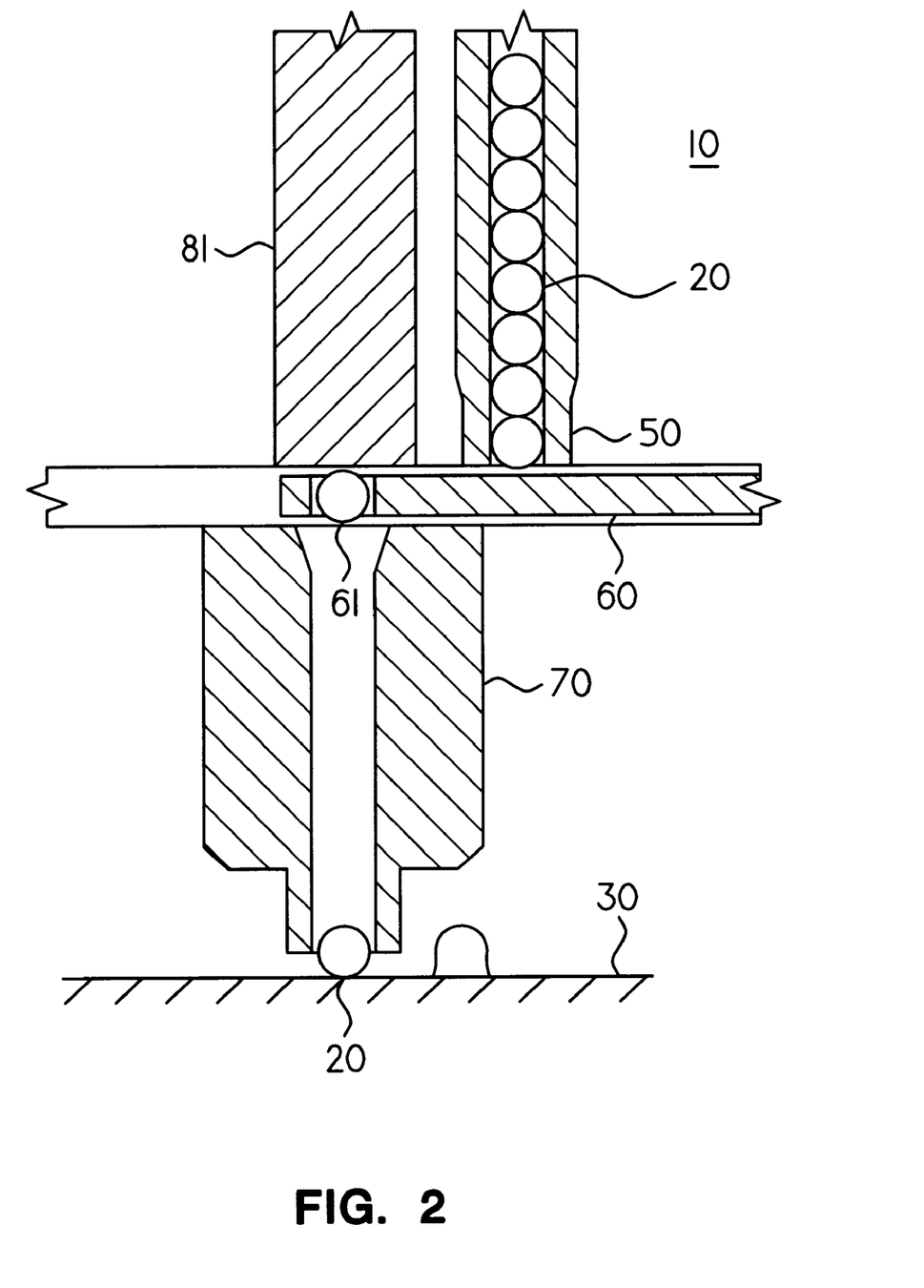
FIG. 2 is an illustrated cutaway side view of an exemplary embodiment of the present invention.

In further detail, a preferred embodiment of the delivery and reflow apparatus 10 is shown in the FIG. 2 cutaway view of a capillary 70, laser 80 and fiber optic 81 located directly above and centered over the capillary 70, an indexing slide 60 coupled to the capillary 70, and a portion of a feed tube 50 coupled to the indexing slide 60. As illustrated in FIG. 2, the capillary 70 is positioned directly above the substrate 30 and above the position on the substrate 30 where the solder ball 20 is to be reflowed. In operation, the capillary 70 guides each individual solder ball 20 to the position on the substrate 30 where the solder ball 20 is desired to be reflow.

Each solder ball 20 is indexed to the top of the capillary 70 by an indexing means 60. In one preferred embodiment, as shown in FIG. 2, the indexing means may be a slide mechanism 60. The slide mechanism 60 individually indexes a solder ball 20 from the feed tube 50 to the top of the capillary 70 by a notch 61 cut into the slide 60. When the indexing slide 60 is translated to the right, as shown in FIG. 2(b), notch 61 is directly below the feed tube 50, and one solder ball moves into the slide notch 61. When the indexing slide 60 is then translated to the left to a position where the slide notch 61 is directly over the top of the capillary 70, as shown in FIG. 2(b), the solder ball 20 in the slide notch 61 is released and is guided down the capillary 70 onto the substrate 30.

In a preferred embodiment the capillary 70 may be approximately ten solder ball diameters in length. While capillaries with a length in excess of ten solder ball diameters may be effectively used, if the length of the capillary is substantially more than ten solder ball diameters, the time for the solder ball 20 to fall or be guided through the capillary and to the substrate 30 will increase. With an increase in time for the solder ball to be placed on the substrate 30, the ultimate speed of delivery and reflow of the solder could be detrimentally affected.

As shown in the FIG. 2 exemplary embodiment, the capillary interior diameter may be approximately the same dimension as the diameter of the solder balls being placed and reflowed to the substrate 30. Although for a given size capillary, smaller diameter solder balls may also be used, such solder balls may have a tendency to deflect and bounce off the capillary side walls and may not be precisely placed in the center of the capillary when finally set on the substrate prior to being reflowed.

Figure 3:
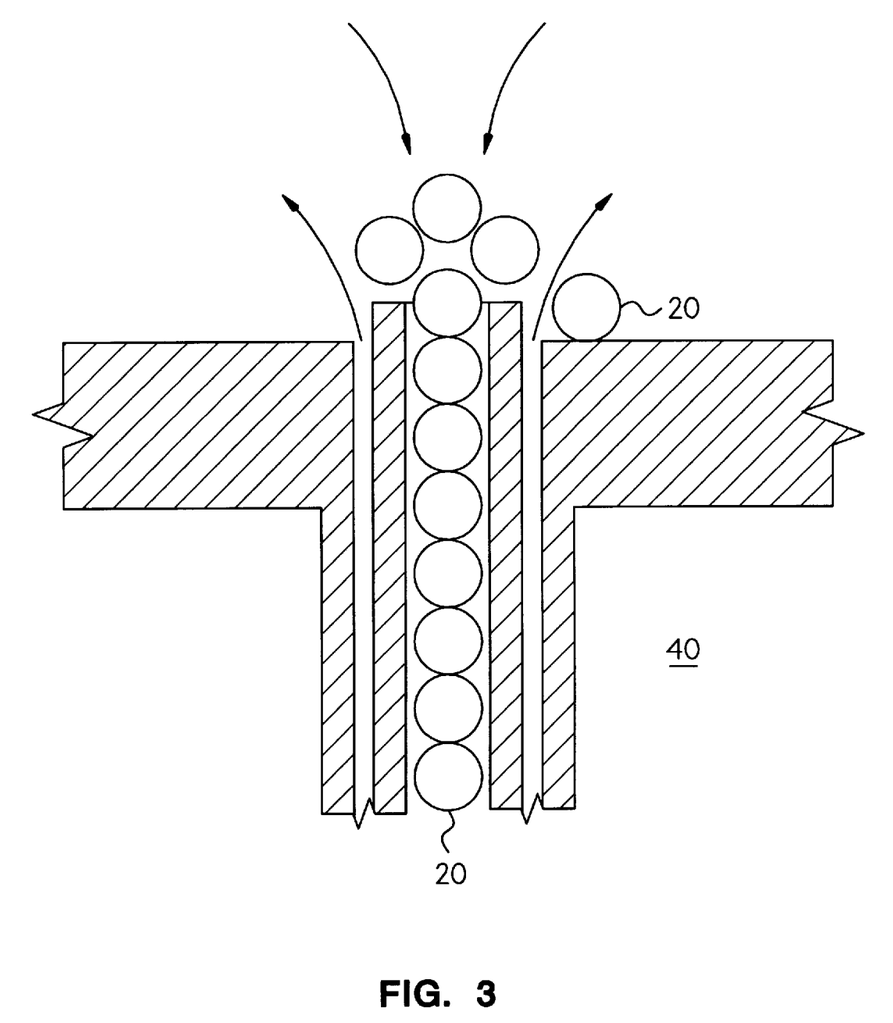
FIG. 3 is an illustrated cutaway side view of an exemplary embodiment of a reservoir used in the present invention.

The exterior diameter of the capillary at the end in proximity to the substrate 30, as shown in FIG. 2 and FIG. 3, may approximately be, in a preferred embodiment, two solder ball diameters. By making the exterior diameter of the capillary narrow, the solder balls may be effectively positioned in close proximity to each other, or in close proximity to other components previously attached to the substrate 30. In another exemplary embodiment, where the capillary end is not narrow, the capillary diameter could be the limiting dimension determining how close adjacent solder balls could be placed to each other. Similarly, if a wide capillary end were used, the width would determine how close a solder connection point could be place to a component previously attached to the substrate 30. With space on a substrate being a premium, and with the required density of solder connection points increasing, the ability to closely place solder balls is an important feature of the present invention.

As such, in a preferred embodiment of the present invention, to best ensure correct deliver and positioning of the solder balls onto the substrate 30, where different diameter solder balls are used, a different capillary having an interior diameter that is similar to the solder balls being reflowed could be used.

In another preferred embodiment, the solder ball 20 may be urged down the capillary 70 and held in place on the substrate 30 by a pressurized fluid flowing coaxially with the laser fiber optic 81 and through the capillary 70. The use of pressurized fluid to push the solder material 20 onto the substrate 30 tends to reduce the time for the solder ball 20 to be properly placed on the substrate surface by reducing solder ball bounce. The pressure of the fluid need only be in the approximate range of one atmosphere. By using an inert gas, such as nitrogen, as the pressurized fluid, the solder balls may also be maintained in a nonoxidizing environment while in the capillary 70 and prior to and during reflow of the solder ball 20 to the substrate 30. Because solder material is typically an alloy composed of tin and lead, the solder has a tendency to quickly oxidize in an open air environment. Maintaining the solder in a non-oxidizing environment prevents undesired oxidation which could impede proper reflow of the solder to the substrate 30.

The delivery of the solder balls from the reservoir 40 through the feed tube 50 and into the capillary 70 provides a multitude of junction points where the solder balls 20 may jam or clog. This is particularly the case at the exit location of the reservoir 40 into which the feed tube 50 is coupled. In a preferred embodiment of the present invention, a positive pressure fluid may be introduced into the reservoir 40 to urge the solder balls into and through the feed tube 50, and finally into the indexing means 60.

Figure 4:
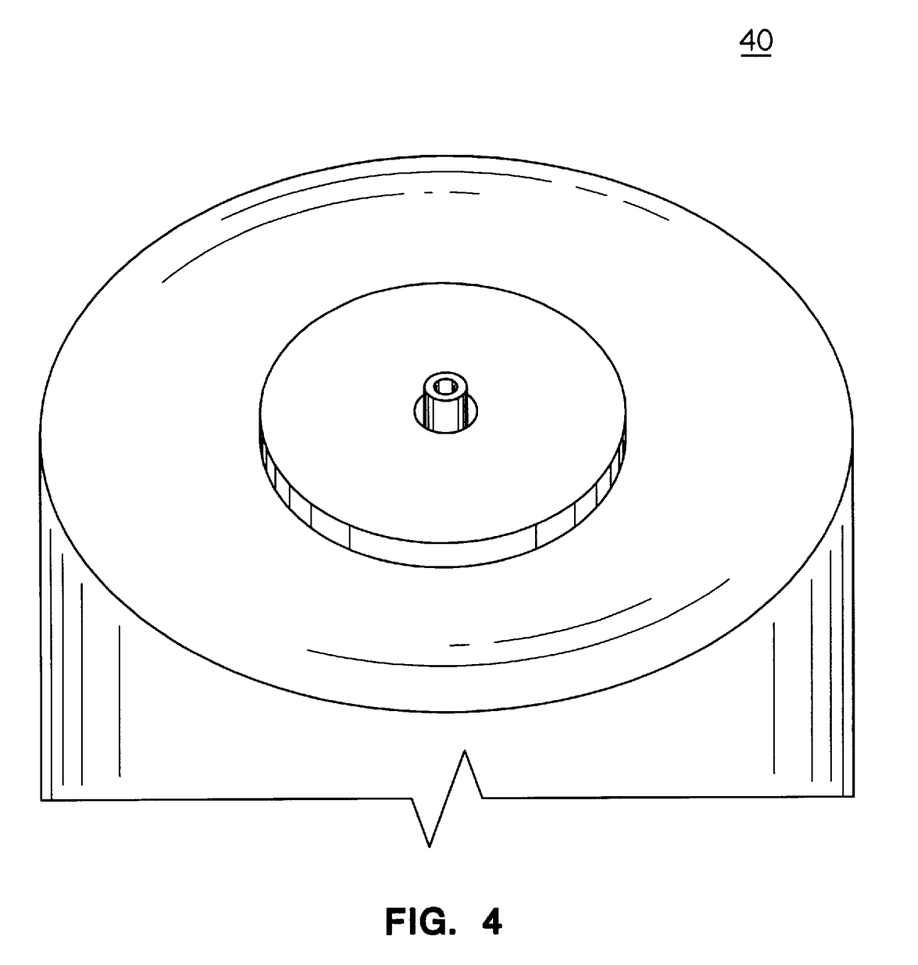
FIG. 4 is a cutaway interior view of an exemplary embodiment of a reservoir used in the present invention.

While direct introduction of a pressurized fluid into the reservoir 40 tends to urge the solder balls into the feed tube 50, it has been found that significant improvement in reducing solder material jams can be achieved if, as shown in FIG. 3 and FIG. 4, the pressurized fluid is introduced into the reservoir 40 coaxial with the feed tube exit location. It is believed that the pressurized fluid flow into the reservoir 40 prevents the solder balls from coagulating at the feed tube entrance and forms fluid currents that draw solder balls into the feed tube 50 without jams. One exemplary embodiment of this coaxial introduction of a pressurized fluid is by using coaxial tubes, as illustrated in FIG. 3, such that the internal tube is used to guide and deliver the solder balls to the indexing means, while the space formed by the annulus between the internal tube and the external tube is used to carry the pressurized fluid into the reservoir 40.

In addition to preventing jamming of the solder balls in the reservoir 40 and through the feed tube 50, as described above, in another preferred embodiment, the pressurized fluid may be an inert gas, such as nitrogen. Through the use of an inert gas, the environment that the solder balls are exposed to from the reservoir 40 all the way to the substrate 30 is nonoxidizing. As explained above, the solder balls have a tendency to quickly oxidize in an open air environment. Indeed, the vibration of the solder balls causing them to collide with each other accelerates surface oxidation and causes the solder balls to discolor. Such surface oxidation may prevent proper reflow of the solder ball 20 to the substrate 30 and could reduce the quality of the final product to be used in construction of IC chips and semiconductors.

Figure 5:
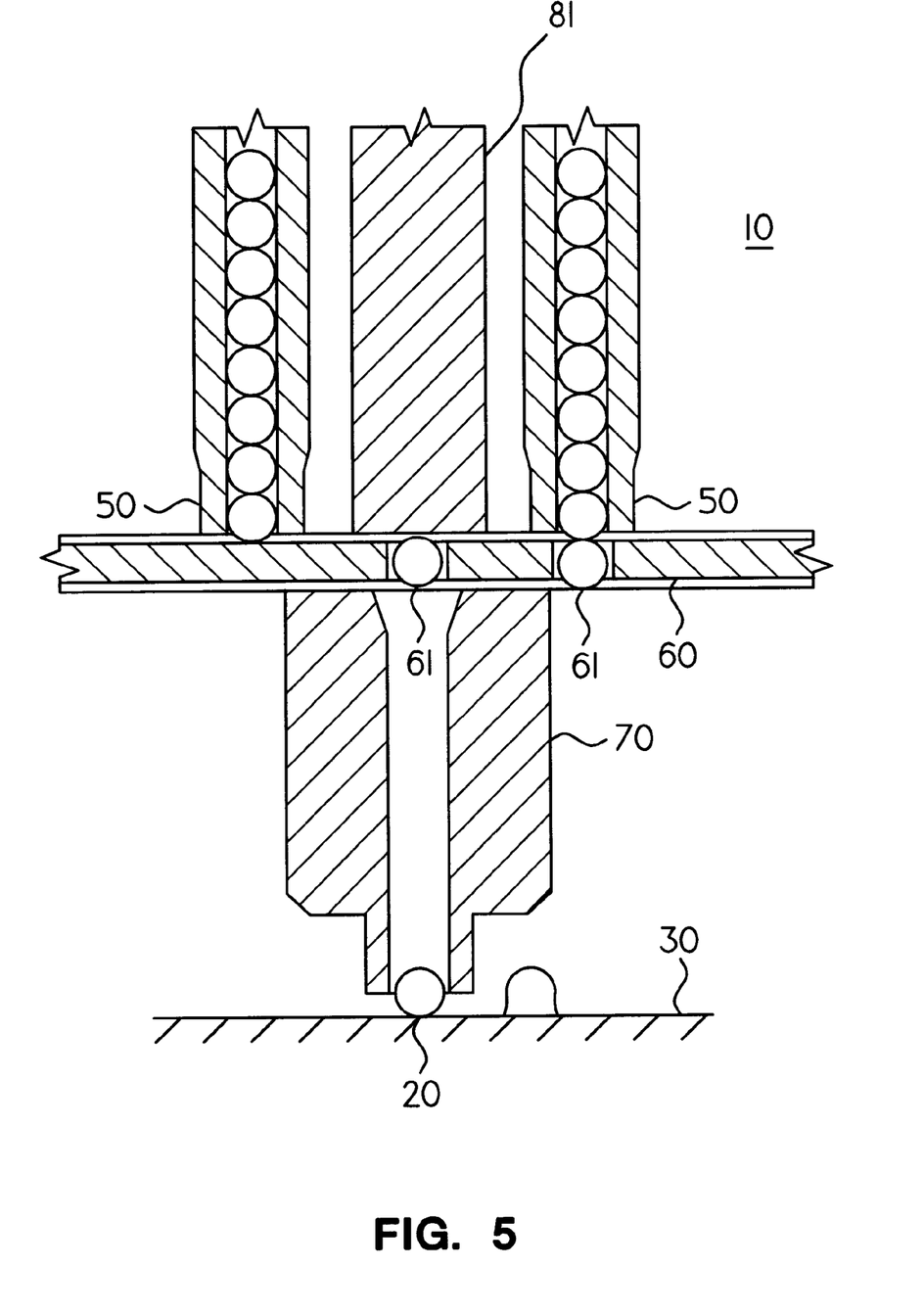
FIG. 5 is an illustrated cutaway side view of a second exemplary embodiment of the present invention.

As shown in FIG. 5, in another preferred embodiment of the present inventive apparatus 10, the indexing slide 60 may be configured as a bi-directional slide. In this configuration, two feed tubes 50 would be used to deliver solder balls to the capillary 70. The bidirectional slide would have two notches 61 cut therein such that, in one embodiment, when a first notch is positioned under a first feed tube, the second notch is positioned over the top of the capillary 70. Similarly, when the slide 60 is then translated to the opposite position where the first notch is positioned over the top of the capillary 70, and thereby releases the solder ball 20 into the capillary 70, the second notch is positioned under the second feed tube to accept another solder ball 20. Through the use of a bi-directional slide, the delivery and reflow rate of the present invention could be substantially increased. Moreover, in another preferred embodiment, the use of a pressurized fluid flowing coaxially with the laser fiber optic 81 and through the capillary 70 as described above, would assist in reducing the time to delivery the indexed solder balls through the capillary 70. This ultimately translates into increased speed of delivery and reflow of the solder material.

As described above, in a preferred embodiment, the capillary 70 may be approximately ten solder ball diameters in length and may have an interior diameter of approximately the same diameter of the solder balls being placed and reflowed to the substrate 30. In a further preferred embodiment, the capillary 70 may be constructed of a carbide material. As manufactured of such material, the capillary interior may be used to direct the laser energy to the solder material positioned on the substrate 30. In such an embodiment, the capillary 70 may be manufactured from a polished tungsten, carbide material to improve reflection of the laser 80. The reflection of the laser energy assists in focussing the energy upon the solder material positioned on the substrate 30 to ensure proper reflow.

In a further preferred embodiment, a computer or data processor (not shown) may be coupled to the delivery and reflow system 10 to automatically control the capillary 70 positioning. Specifically, the computer would control the x-y-z location of the capillary 70 for each of the solder connection points desired to the positioned on the substrate 30. Through the use of such a programmable computer, the pattern of solder ball placement can be easily revised, reconfigured or updated.

The method of operating a high-speed solder ball delivery and reflow system would, in an exemplary embodiment, include the steps as disclosed herein. That is, through the introduction of a pressurized fluid into a reservoir holding solder material, the solder is urged through a feed tube towards a capillary. The second step is to individually index the solder material delivered through the feed tube into a capillary. A third step, also using a pressurized fluid, is to direct the individual solder material indexed to the capillary, through the capillary and onto the substrate surface. Finally, the solder material is reflowed to the substrate by an energy source. As disclosed above for the exemplary embodiments of the apparatus, the energy source may be a laser. After the delivery and reflow of a solder ball to the substrate, the capillary may be repositioned over the substrate to a new location to delivery and reflow another solder ball. The x-y position control of the capillary may be accomplished by reading successive data locations from a computer memory.

Although the invention has been described with reference to exemplary embodiments, it is not limited thereto. It is intended to be and understood that the following appended claims should be construed to include other variants and embodiments of the invention which may be made by those skilled in the art as being within the true spirit and scope of the present invention.

What is claimed is:

1. An apparatus for delivering and reflowing solder material onto a substrate, comprising:
    a reservoir to hold the solder material;
    a capillary for guiding the solder material to the substrate;
    a feed tube coupled to the reservoir for directing the solder material from the reservoir to the capillary;
    indexing means coupled to the feed tube and the capillary to individually index the solder material from the feed tube into the capillary;
    deliver means to deliver the solder material from the reservoir, through (a) the feed tube, (b) the indexing means, (c) the capillary and onto the substrate; and
    an energy source coupled to the capillary to reflow the solder material onto the substrate,
    wherein the delivery means comprises:
        a pressurized fluid introduced into the reservoir to urge the solder material through the feed tube, through the indexing means, through the capillary and onto the substrate.

2. The apparatus according to claim 1, wherein the energy source is a laser.

3. The apparatus according to claim 1, wherein the pressurized fluid is an inert gas to maintain the solder material in a nonoxidizing environment from the reservoir to the substrate.

4. The apparatus according to claim 3, wherein the inert gas is nitrogen.

5. The apparatus according to claim 1, wherein the pressurized fluid is introduced into the reservoir coaxial with the feed tube.

6. The apparatus according to claim 1, wherein the feed tube comprises a first tube and a second tube within the first tube, such that the second tube is substantially centered within the first tube, the second tube being for delivery of the solder material from the reservoir and the first tube for delivery of the pressurized fluid into the reservoir.

7. The apparatus according to claim 1, wherein the solder material is substantially shaped as balls.

8. The apparatus according to claim 7, wherein the delivery and reflowing of the solder balls is approximately at least 40 balls each second.

9. The apparatus according to claim 1, further comprising:
    a plurality of feed tubes to direct the solder material from the reservoir; and
    means to index the solder material sequentially from the plurality of feed tubes into the capillary.

10. The apparatus according to claim 1, wherein the energy source is directed to the solder and substrate through the capillary.

11. The apparatus according to claim 1, wherein the capillary has an end proximate to the substrate, said end having an exterior diameter approximately in the range of two solder material diameters or less.

12. The apparatus according to claim 1, further comprising means to reposition the capillary to a new location on the substrate to deliver and reflow the solder material.

13. The apparatus according to claim 12, wherein the reservoir is separated from the capillary and stationary.

14. An apparatus for delivering and reflowing solder material onto a substrate, comprising:
    a reservoir to hold the solder material;
    a capillary for guiding the solder material to the substrate;
    a feed tube coupled to the reservoir for directing the solder material from the reservoir to the capillary;
    indexing means coupled to the feed tube and the capillary to individually index the solder material from the feed tube into the capillary;
    deliver means to deliver the solder material from the reservoir, through (a) the feed tube, (b) the indexing means, (c) the capillary and onto the substrate; and
    an energy source coupled to the capillary to reflow the solder material onto the substrate,
    wherein the energy source uses the capillary to focus the reflowing energy onto the solder.

15. An apparatus for delivering and reflowing solder material onto a substrate, comprising:
    a reservoir to hold the solder material;
    a capillary for guiding the solder material to the substrate;
    a feed tube coupled to the reservoir for directing the solder material from the reservoir to the capillary;
    indexing means coupled to the feed tube and the capillary to individually index the solder material from the feed tube into the capillary;
    deliver means to deliver the solder material from the reservoir, through (a) the feed tube, (b) the indexing means, (c) the capillary and onto the substrate; and
    an energy source coupled to the capillary to reflow the solder material onto the substrate,
    wherein the capillary is made of an alumina or polished tungsten carbide material.

16. A solder delivery and reflow apparatus for delivering and reflowing solder balls onto a substrate, comprising:
    a reservoir containing the solder balls;
    a repositionable, lightweight capillary for directing individual solder balls onto the substrate;
    a feed tube for guiding the solder balls from the reservoir to the capillary;
    indexing means to individually move solder balls from the feed tube to the capillary;
    delivery means to deliver the solder balls through the feed tube, through the indexing means, through the capillary and onto the substrate;
    an energy source to reflow the solder balls onto the substrate; and
    repositioning means to reposition the capillary to a new location on the substrate to deliver and reflow another solder ball,
    wherein the delivery means is a pressurized fluid introduced into the reservoir to urge the solder material through (a) the feed tube, (b) the indexing means, (c) the capillary, and to the substrate.

17. The apparatus according to claim 16, wherein the indexing means is a translating slide mechanism.

18. The apparatus according to claim 16, wherein the reservoir is stationary.

19. A method of delivering and reflowing solder material onto a substrate, the method comprising the steps of:
   (a) urging solder material held in a reservoir through a feed tube by a pressurized fluid;
   (b) individually indexing the solder material from the feed tube into a capillary under pressure from the pressurized fluid;
   (c) directing the individual solder material through the capillary to the substrate under pressure from the pressurized fluid; and
   (d) reflowing the individual solder material to the substrate with an energy source.

20. A method of delivering and reflowing solder material onto a substrate, the method comprising the steps of:
   (a) urging solder material held in a reservoir through a feed tube by a pressurized fluid;
   (b) individually indexing the solder material from the feed tube into a capillary;
   (c) directing the individual solder material through the capillary to the substrate;
   (d) reflowing the individual solder material to the substrate with an energy source; and
   (e) repositioning the capillary to a new location on the substrate to deliver and reflow another individual solder material.

21. A method of delivering and reflowing solder material onto a substrate, the method comprising the steps of:
   (a) urging solder material held in a reservoir through a feed tube by a pressurized fluid;
   (b) individually indexing the solder material from the feed tube into a capillary;
   (c) directing the individual solder material through the capillary to the substrate; and
   (d) reflowing the individual solder material to the substrate with an energy source,
   wherein the energy source is a laser directed to the individual solder material through the capillary.

22. An apparatus for delivering and reflowing solder material onto a substrate, comprising:
   a stationary reservoir to hold the solder material;
   a translatable capillary for guiding the solder material to the substrate;
   a feed tube coupled to the reservoir for directing the solder material from the reservoir to the capillary;
   indexing means coupled between the feed tube and the capillary to individually index the solder material from the feed tube into the capillary;
   deliver means to deliver the solder material from the reservoir, through (a) the feed tube, (b) the indexing means, (c) the capillary and onto the substrate, a pressurized fluid introduced into the reservoir to urge the solder material through the feed tube, through the indexing means, through the capillary and onto the substrate; and
   an energy source coupled to the capillary to reflow the solder material onto the substrate.

23. The apparatus according to claim 22, wherein the indexing means provides the solder material to a top of the capillary.

* * * * *

UNITED STATES PATENT AND TRADEMARK OFFICE
CERTIFICATE OF CORRECTION

PATENT NO. : 6,227,437 B1
DATED : May 8, 2001
INVENTOR(S) : Eli Razon et al.

It is certified that error appears in the above-identified patent and that said Letters Patent is hereby corrected as shown below:

<u>Title page,</u>
Item [73], Assignee, should read -- Kulicke & Soffa Investments, Inc. --.

Signed and Sealed this

Seventeenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.    : 6,227,437 B1
DATED         : May 8, 2001
INVENTOR(S)   : Eli Razon et al.

It is certified that error appears in the above-identified patent and that said Letters Patent is hereby corrected as shown below:

<u>Title page,</u>
Item [73], Assignee, should read -- Kulicke & Soffa Investments, Inc. --

Signed and Sealed this

Thirty-first Day of December, 2002

JAMES E. ROGAN
*Director of the United States Patent and Trademark Office*